(12) United States Patent
Park et al.

(10) Patent No.: US 7,161,398 B2
(45) Date of Patent: Jan. 9, 2007

(54) VCDL-BASED DUAL LOOP DLL HAVING INFINITE PHASE SHIFT FUNCTION

(75) Inventors: Hong June Park, Kyungbuk (KR); Seung Jun Bae, Kyungbuk (KR)

(73) Assignee: Postech (KR)

( * ) Notice: Subject to any disclaimer, the term of this patent is extended or adjusted under 35 U.S.C. 154(b) by 0 days.

(21) Appl. No.: 11/142,698

(22) Filed: Jun. 1, 2005

(65) Prior Publication Data

US 2006/0145740 A1 Jul. 6, 2006

(30) Foreign Application Priority Data

Jan. 3, 2005 (KR) .................. 10-2005-0000010

(51) Int. Cl.
*H03L 7/06* (2006.01)
(52) U.S. Cl. ..................... 327/149; 327/158
(58) Field of Classification Search ............. 327/149, 327/153, 158, 161, 162, 163; 331/1 A, 25, 331/17; 375/373, 374, 375, 376
See application file for complete search history.

(56) References Cited

U.S. PATENT DOCUMENTS 6,812,760 B1 * 11/2004 Kim et al. .................. 327/158
6,868,504 B1 * 3/2005 Lin ............................ 713/500

* cited by examiner

*Primary Examiner*—Linh My Nguyen
(74) *Attorney, Agent, or Firm*—Cantor Colburn LLP (57) ABSTRACT

Provided is a dual loop DLL for generating an internal clock signal synchronized with an external clock, which includes a reference DLL receiving a reference clock and generating a plurality of phase clock signals having a first phase difference, a coarse loop selecting one of the phase clock signals and generating first through third digital codes to allow the internal clock signal to have a phase difference smaller than a second phase difference with respect to the external clock, and a fine loop selecting two of the phase clock signals and synchronizing the internal clock signal with the external clock, in response to the first through third digital codes.

11 Claims, 10 Drawing Sheets

| Region | Up/Down | Hold | R_SEL±1 |
|---|---|---|---|
| A | 0 | 0 | R_SEL+1(+T/8) |
| B | 0 | 1 | R_SEL+1(+T/8) |
| C | 1 | 1 | R_SEL−1(+T/8) |
| D | 1 | 0 | R_SEL−1(+T/8) |

VCDL-BASED DUAL LOOP DLL HAVING INFINITE PHASE SHIFT FUNCTION

BACKGROUND OF THE INVENTION

1. Field of the Invention

The present invention relates to a semiconductor integrated circuit, and more particularly, to a VCDL-based dual loop DLL having an infinite phase shift function.

2. Description of the Related Art

For a high speed operation of a synchronous semiconductor memory device, a delay locked loop (DLL) and a phase locked loop (PLL) are used to remove a delay component of a clock signal.

The DLL is a first system and has a smaller jitter and a faster lock-time than the PLL because a phase noise is not accumulated in the voltage controlled delay line (VCDL). The PLL is a third system and, due to a feedback operation of the PLL, the phase noise is accumulated in a voltage controlled oscillator (VCO). Accordingly, the DLL is widely used for synchronizing a clock signal or generating clock signals having various phases.

Figure 1:
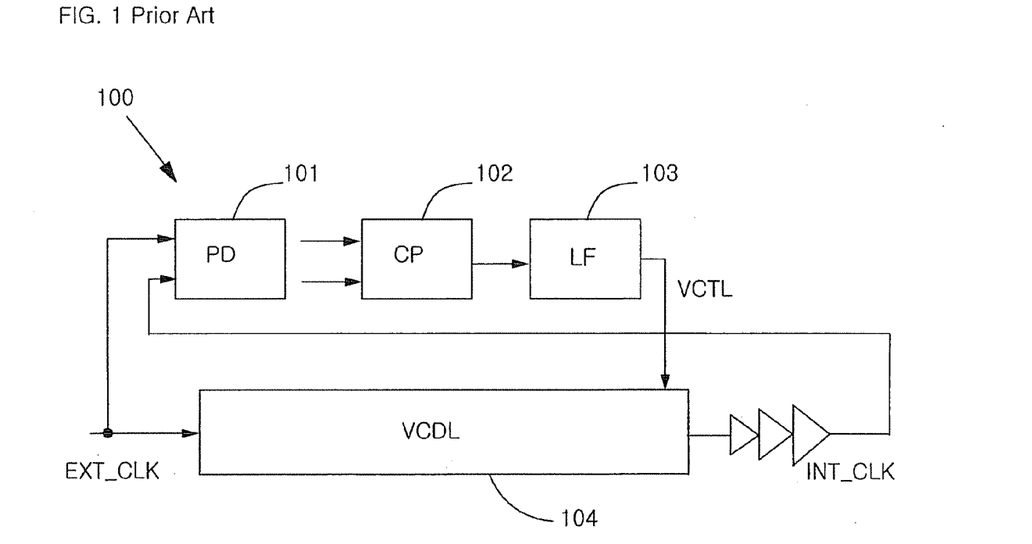
FIG. 1 is a circuit diagram of a typical DLL.

FIG. 1 shows a typical DLL. Referring to FIG. 1, a DLL 100 includes a phase detector PD 101, a charge pump CP 102, a loop filter LF 103, a VCDL circuit 104, and a replica buffer 105, to generate an internal clock INT_CLK synchronized with a received external clock EXT_CLK.

The PD 101 compares a degree of delay between the external clock EXT_CLK and the internal clock INT_CLK and transfers a delay difference to the CP 102. The CP 102 generates a control signal VCTL which is proportional to a delay difference between the external clock EXT_CLK and the internal clock INT_CLK, through the LF 103. The LF 103 removes a high frequency component in an output of the PD 101. The VCDL 104, in response to the control signal VCTL, decreases or increases delay of the external clock EXT_CLK. The replica buffer 105 reflects a delay on a signal path along which the generated internal clock INT_CLK is transferred. Accordingly, the DLL 100 matches edges of the external clock EXT_CLK and the internal clock INT_CLK.

The DLL 100 has a limited frequency range in its operation. That is, when the cycle of the external clock signal EXT_CLK is T, to lock the DLL 100, the VCDL circuit 104 and the replica buffer 105 must have a delay time between 0.5 T and 1.5 T during the initial operation which is needed for the operation of the PD 101. Thus, the DLL 100 requires an additional circuit to make the initial delay time to be 0.5 T and 1.5 T.

Figure 2:
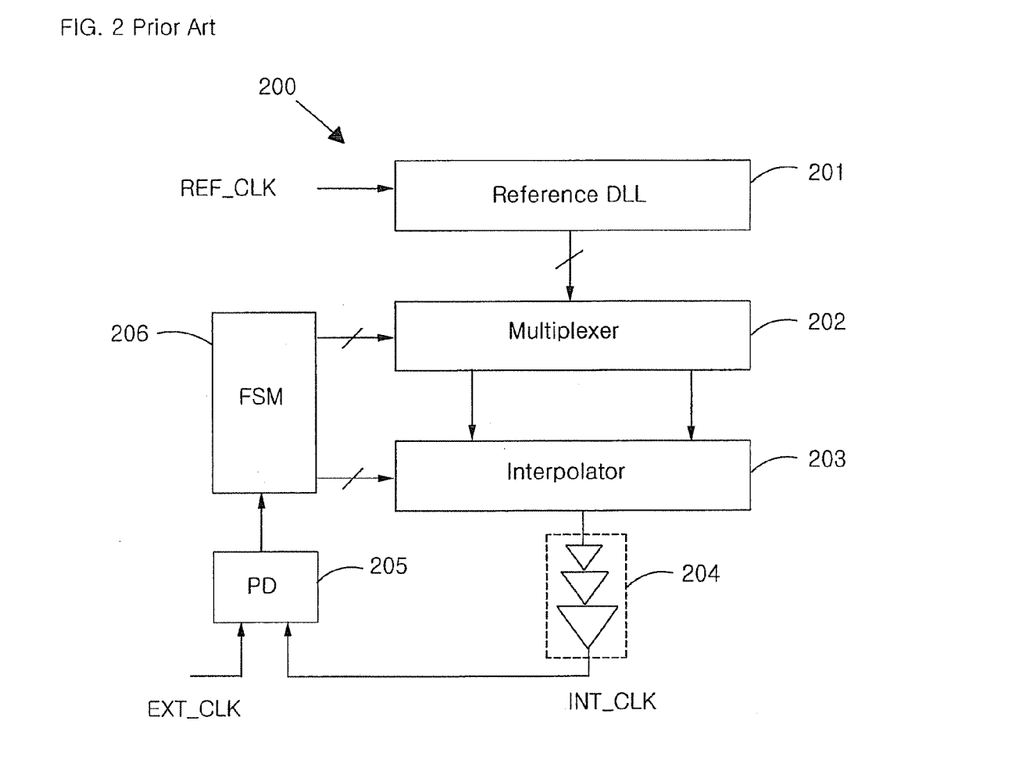
FIG. 2 is a circuit diagram of a conventional dual loop DLL.

To solve the frequency range problem of the DLL 100, a dual loop DLL has been developed. As shown in FIG. 2, a dual loop DLL 200 includes a reference DLL 201, a multiplexer 202, a phase interpolator 203, a replica buffer 204, a phase detector PD 205, and a final state machine. The reference DLL 201 has the same constituent elements as those of the DLL 100 of FIG. 1, except for the replica buffer 105.

The conventional DLL 100 of FIG. 1 has a condition that the initial delay time of the VCDL circuit 104 of FIG. 1 has a value between 0.5 T and 1.5 T. In contrast, since the reference DLL 201 does not include the replica buffer 105 of FIG. 1, the VCDL circuit 104 of FIG. 1 only is to be controlled. Thus, the reference DLL 201 is easy to lock regardless of changes in a process, a voltage and a temperature (PVT). In the duel loop DLL 200, the minimum value and the maximum value in the frequency range of the reference DLL 201 are inverse numbers of the maximum delay time and the minimum delay time of the VCDL circuit 104 of FIG. 1. Accordingly, the dual loop DLL 200 has the operation frequency range which is greatly increased than the conventional DLL 100.

The dual loop DLL 200 has an infinite phase shift function which enables a seamless phase change by a phase interpolation function of the phase interpolator 203. That is, the phase of the internal clock INT_CLK that is an output clock of the dual loop DLL 200 can be infinitely increased or decreased without losing the locking of the reference DLL 201. This function makes the dual loop DLL 200 to be used in a plesiochronous clock system or a clock data recovery CDR circuit.

The dual loop DLL 200 initially used an analog phase interpolator. However, a digital phase interpolator is widely used for the dual loop DLL 200 to reduce a slow change of an input signal needed for the phase interpolator and jitter generated during the change of the input signal. However, the minimum jitter of the dual loop DLL 200 using the digital phase interpolator becomes a hindrance to a time unit value of the phase interpolator 203. Therefore, a method of reducing jitter while maintaining a wide frequency operation range and a phase change capability of the dual loop DLL 200 is required.

SUMMARY OF THE INVENTION

To solve the above and/or other problems, the present invention provides a VCDL-based dual loop DLL having an infinite phase shift function According to an aspect of the present invention, a dual loop DLL for generating an internal clock signal synchronized with an external clock, comprises a reference DLL receiving a reference clock and generating a plurality of phase clock signals having a phase difference of 45°, a coarse loop selecting one of the phase clock signals and generating first through third digital codes to have a phase difference less than 90° between the Internal clock signal and the external clock signal, and a fine loop selecting two of the phase clock signals and synchronizing the internal clock signal with the external clock, in response to the first through third digital codes.

The reference DLL comprises a first phase detector and charge pump sync portion detecting a phase of a first phase clock signal and a phase of a fifth phase clock signal having a phase difference of 180° with respect to the first phase clock signal and generating a charge pump enable signal and a first control voltage, in response to a reset signal, a second phase detector and charge pump portion detecting the phase of the first phase clock signal and a phase of a ninth phase clock signal having a phase difference of 360° with respect to the first phase clock signal and generating the first control voltage proportional to the phase difference, a first loop filter removing jitter of the first control voltage, a voltage regulator receiving the first control voltage and a second control voltage and generating the second control voltage, a VCDL circuit portion receiving the second control voltage as a power voltage, including a plurality of delay cells connected in series and receiving the reference clock as an input, and generating outputs of the delay cell as voltage control signals, a level converter and buffer portion receiving the voltage control delay signals and generating a plurality of phase clock signals; and a second loop filter removing jitter of the second control voltage.

The coarse loop comprises a 8:1 MUX portion selecting one of the phase clock signals in response to the first digital code and generating a first control clock signal, a first delay portion receiving the first control clock signal, an inverter receiving the first control clock signal, a fine voltage control delay line (FVCDL) circuit portion including a plurality of delay cells connected in series and receiving an output of the first delay portion and driven by a control voltage generated by the reference DLL, the second delay portion receiving an output of the FVCDL circuit portion, a replica buffer portion receiving an output of the second delay portion and generating a coarse clock signal, a coarse phase detecting portion comparing a phase difference between the external clock signal and the coarse clock signal and generating an up/down signal and a hold signal, and a final state machine (FSM) storing portion enabled by the first control clock signal that is an output of the inverter and delayed, and generating the first through third digital codes in response to the up/down signal and the hold signal.

The fine loop comprises a first 8:1 MUX portion selecting one of the phase clock signals in response to the first digital code and generating a second control clock signal, a second 8:1 MUX portion selecting one of the phase clock signals in response to the third digital code and generating a third control clock signal, a first 2:1 MUX portion selecting the second control clock signal or the third control clock signal in response to the second digital code and providing the selected signal to a first fine voltage control delay line (FVCDL) circuit portion, a second 2:1 MUX portion selecting the second control clock signal or the third control clock signal in response to the second digital code and providing the selected signal to a second fine voltage control delay line (FVCDL) circuit portion, the first fine voltage control delay line (FVCDL) circuit portion including a plurality of delay cells connected in series and receiving the second control clock signal or the third control clock signal provided by the first 2:1 MUX portion, the delay cells being driven by a first control voltage output from a first charge pump or loop filter, the second fine voltage control delay line (FVCDL) circuit portion including a plurality of delay cells connected in series and receiving the second control clock signal or the third control clock signal provided by the second 2:1 MUX portion, the delay cells being driven by a second control voltage output from a second charge pump or loop filter, a third 2:1 MUX portion providing an output of the first fine voltage control delay line (fVCDL) circuit portion or an output of the second fine voltage control delay line (fVCDL) circuit portion to a first replica buffer portion, in response to the second digital code, the first replica buffer portion receiving an output of the third 2:1 MUX portion and generating the internal clock signal, a fourth 2:1 MUX portion providing an output of the first fine voltage control delay line (fVCDL) circuit portion or an output of the second fine voltage control delay line (fVCDL) circuit portion to a second replica buffer portion, in response to the second digital code, the second replica buffer portion receiving an output of the fourth 2:1 MUX portion and generating a fourth control clock signal, a fifth 2:1 MUX portion providing the internal clock signal or the fourth control clock signal to a first phase detector, in response to the second digital code, the first phase detector detecting a phase difference between the external clock signal and the internal clock signal or the fourth control clock signal provided by the fifth 2:1 MUX portion, the first charge pump and loop filter generating the first control voltage proportional to the phase difference detected by the first phase detector and providing the generated first control voltage to the first fine voltage control delay line (FVCDL) circuit portion, a sixth 2:1 MUX portion providing the external clock signal or the fourth control clock signal to a second phase detector in response to the second digital code, the second phase detector detecting a phase difference between the internal clock signal and the external clock signal or the fourth control clock signal provided by the sixth 2:1 MUX portion, and the second charge pump and loop filter generating the second control voltage proportional to the phase difference detected by the second phase detector and providing the generated second control voltage to the second fine voltage control delay line (FVCDL) circuit portion.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

In the accompanying drawings, the same reference numerals denote the same constituent elements.

Figure 3:
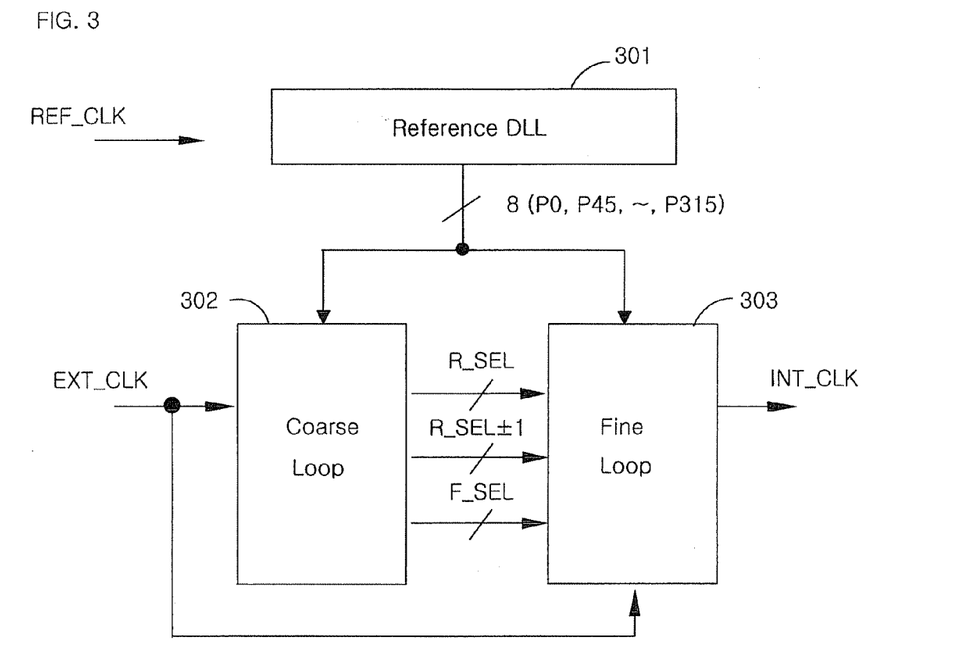
FIG. 3 is a circuit diagram of a dual loop DLL according to a preferred embodiment of the present invention.

FIG. 3 is a circuit diagram of a dual loop DLL according to a preferred embodiment of the present invention. Referring to FIG. 3, a dual loop DLL 300 includes a reference DLL 301, a coarse loop 302, and a fine loop 303.

The reference DLL 301 receives a reference clock REF_CLK and generates eight phase clock signals P0, P45, ..., P315 having an interval of 45°.

The coarse loop 302 selects one of the eight phase clock signals P0, P45, ..., P315 of the reference DLL 301 so that an internal clock INT_CLK that is an output of the dual loop DLL 300 has a phase difference less than 90° with respect to an external clock EXT_CLK. The coarse loop 302 transfers digital values of first through third digital codes R_SEL, F_SEL, and R_SEL±1 to the fine loop 303. The first digital code R_SEL selects one of the eight reference clocks, the second digital code F_SEL controls the switch of two VCDL circuits in the fine loop 303, and the third digital code R_SEL±1 selects a clock that is 45° faster or slower than a selected clock.

The fine loop 303 receives two of the eight phase clock signals P0, P45, . . . , P315 of the reference DLL 301 using the first through third digital codes R_SEL, F_SEL, and R_SEL±1, and synchronizes the internal clock INT_CLK with the external clock EXT_CLK. Since a clock signal Coarse_CLK passing through the coarse loop 302 has a phase difference within 90° with respect to the external clock EXT_CLK, it is sufficient for the fine loop 303 to control a delay time of the VCDL circuit therein to 0.25 T.

The dual loop DLL 300 has a locking time less than that of the conventional dual loop DLL 200 of FIG. 2 because the coarse loop 301 and the fine loop 303 operate at the same time. While the conventional dual loop DLL 200 shifts the phase of the internal clock INT_CLK by the control unit of the phase interpolator 203 or the VCDL circuit, the dual loop DLL 300 in the present embodiment shifts the phase of the internal clock INYT_CLK in an interval of 45° until a coarse locking is established so that an operation speed thereof is fast.

Figure 4:
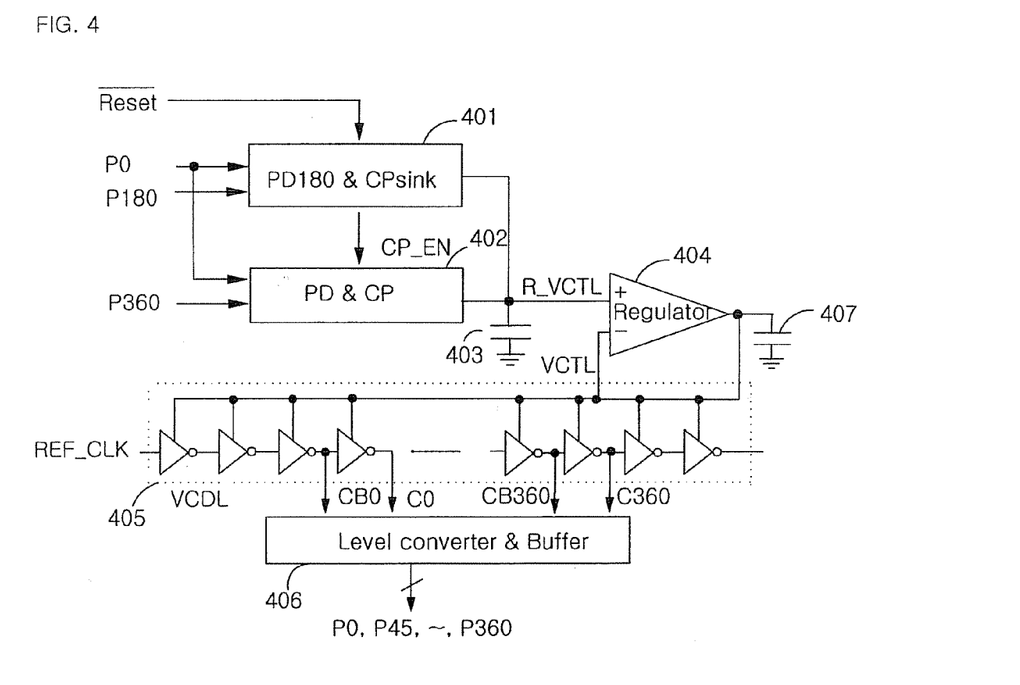
FIG. 4 is a circuit diagram of a reference DLL of FIG. 3.

FIG. 4 shows the reference DLL 301 of FIG. 3. Referring to FIG. 4, the reference DLL 301 includes a first phase detector and charge pump sync portion 401, a second phase detector and charge pump portion 402, a first loop filter 403, a voltage regulator 404, a VCDL circuit portion 405, a level converter and buffer portion 406, and a second loop filter 407.

The first phase detector and charge pump sync portion 401 is used such that a delay time of the VCDL circuit portion 405 of the reference clock REF_CLK has a value between 0.5 T and 1.5 T. The first phase detector and charge pump sync portion 401 in response to a reset signal $\overline{\text{RESET}}$ detects the phase of the first phase clock signal P0 and the fifth phase clock signal P180 and generates a charge pump enable signal CP_EN and a first control voltage R_VCTL.

Figure 5:
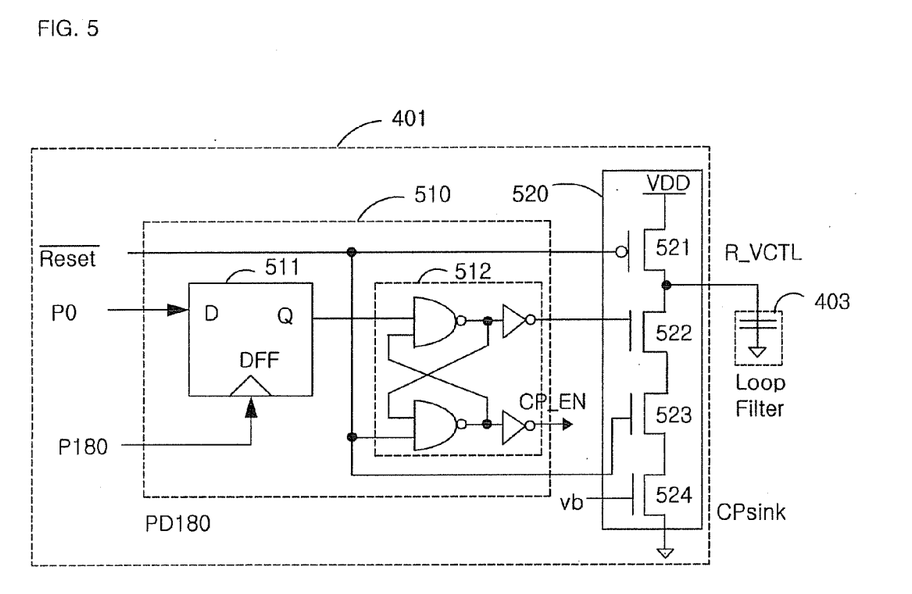
FIG. 5 is a circuit diagram of a first phase detection portion and a charge pump synch portion of FIG. 4.

FIG. 5 shows in detail the first phase detector and charge pump sync portion 401. Referring to FIG. 5, a first phase detection portion 510 includes a D-flipflop 511 for outputting the first phase clock signal P0 in response to the fifth phase clock signal and an S-R latch 512 for generating a charge pump enable signal CP_EN in response to the output of the D-flipflop 511 and the reset signal $\overline{\text{RESET}}$.

The charge pump sync portion 520 generates a first control voltage R_VCTL in response to the reset signal $\overline{\text{RESET}}$, the output of the S-R latch 512, and a bias signal Vb. The charge pump sync portion 520 includes a PMOS transistor 521 and first through third NMOS transistors 522, 523, and 524 which are connected in series between a power voltage VDD and a ground voltage VSS. Gates of the PMOS transistor 521 and the second NMOS transistors 522, 523, and 524 are connected to the reset signal $\overline{\text{RESET}}$, a gate of the first NMOS transistor 522 is connected to an output of the S-R latch 512, and a gate of the third NMOS transistor 524 is connected to the bias signal Vb. Drains of the PMOS transistor 521 and the first NMOS transistor 522 become the first control voltage R_VCTL. The first control voltage R_VCTL is provided to the first loop filter 403 which is formed of a capacitor.

Referring back to FIG. 4, the charge pump enable signal CP_EN generated by the first phase detector and charge pump sync portion 401 is provided to the second phase detector and charge pump portion 402. The second phase detector and charge pump portion 402 detects a phase difference of the first phase clock signal P0 and the ninth phase clock signal P360, and generates the first control voltage R_VCTL which is proportional to the phase difference.

A jitter component of the first control voltage R_VCTL is removed by the first loop filter 403, the voltage regulator 404, the second loop filter 407. A second control voltage VCTL that is an output of the voltage regulator 404 is provided as a power voltage of the VCDL circuit 405. The VCDL circuit 405 is formed of a plurality of delay cells receiving the reference clock REF_CLK and connected in series, and generates a plurality of voltage control delay signals CB0, C0, . . . , CB360, C360. To produce the accurate several phase clock signals P0, P45, . . . , P360, the delay cells must have an accurate duty ratio of 50% of the reference clock REF_CLK. Although a duty corrector is needed, the VCDL circuit 405 uses the delay cells formed of a single signal line. The voltage control delay signals CB0, C0, . . . , CB360, C360 are converted by the level converter and buffer portion 406 to the first through ninth phase clock signals P0, P45, . . . , P360.

The operation of the reference DLL 301 is described below. When the reset signal $\overline{\text{RESET}}$ is activated, the first control voltage R_VCTL becomes the power voltage VDD and the delay time of the VCDL circuit portion 405 has the minimum value. The minimum delay time must be less than T. When the reset signal $\overline{\text{RESET}}$ is deactivated, the delay time of the VCDL circuit portion 405 increases close to T. The second phase detector and charge pump portion 402 operate until the delay time of the VCDL circuit portion 405 is T. When the delay time of the VCDL circuit portion 405 is T, edges of the first phase clock signal P0 and the ninth phase clock signal P360 are accurately matched.

Figure 6A:
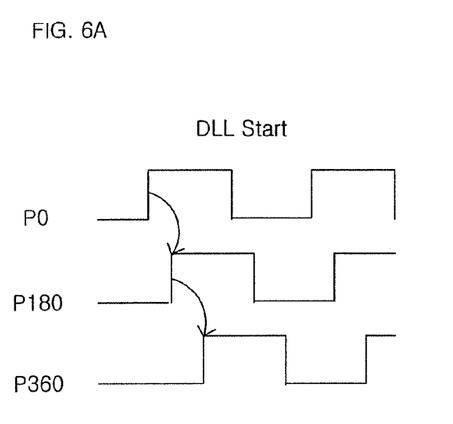
FIGS. 6A and 6B are operation timing diagrams of a reference DLL of FIG. 4.
Figure 6B:
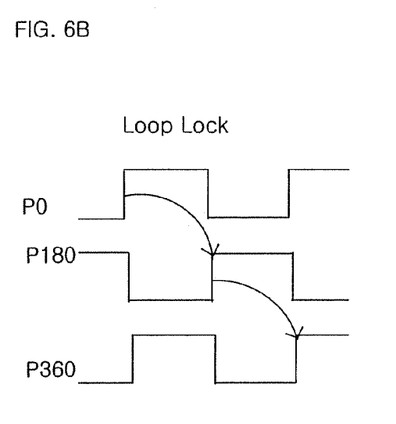

FIGS. 6A and 6B are operation timing diagram of the reference DLL 301. During the initial operation, the phases of the first phase clock signal P0, the fifth phase clock signal P180, and the ninth phase clock signal P360 are twisted. However, when the phase is locked, first phase clock signal P0 and the fifth phase clock signal P180 have a phase difference of T/2 while the first phase clock signal P0 and the ninth phase clock signal P360 have a phase difference of T.

It is assumed that the phase clock signals P0, P45, . . . , P360 of the reference DLL 301 has a duty ratio of 50%. If the duty ratio (d) of the phase clock signals P0, P45, . . . , P360 is not 50%, the delay time of the VCDL circuit portion 405 occurs not at T, but at 2dT, during the initial locking operation. When the duty ratio (d) has the following range, the reference DLL 301 can operate stably.

$$0.25 < d < 0.75 \qquad \text{[Inequity 1]}$$

Figure 7:
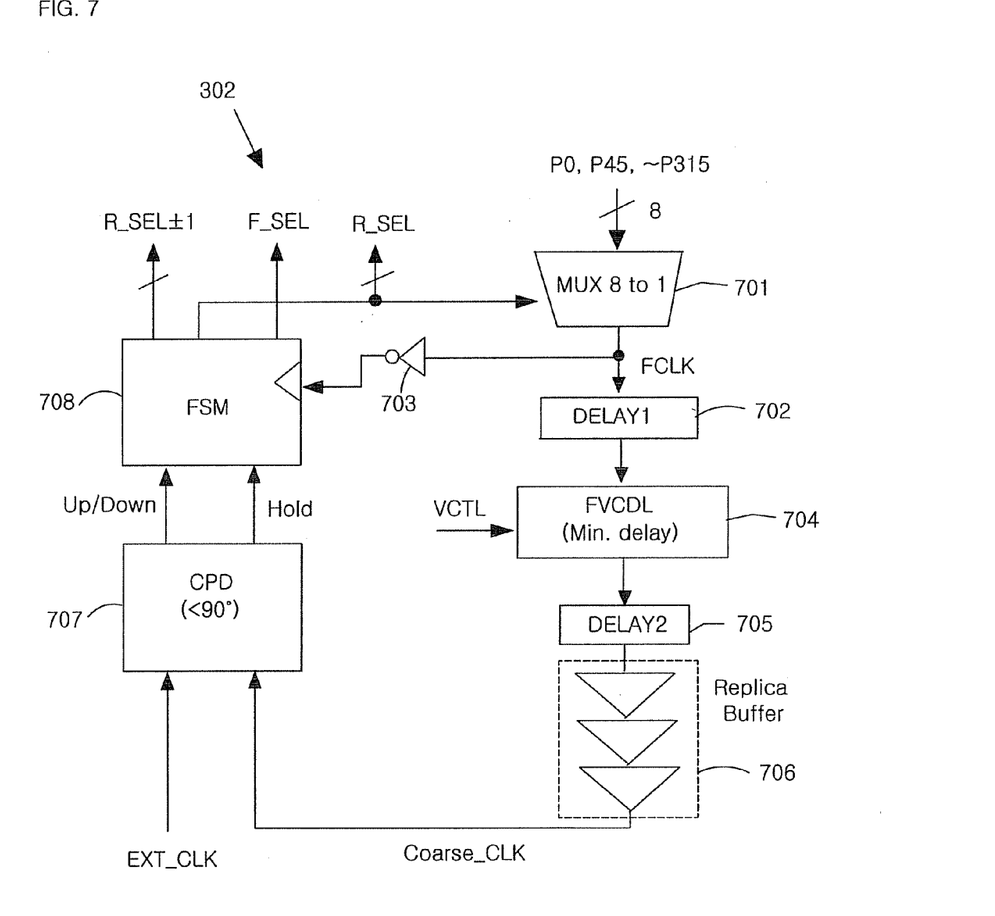
FIG. 7 is a circuit diagram of a coarse loop of FIG. 3.

FIG. 7 illustrates the coarse loop 302 of FIG. 3. Referring to FIG. 7, the coarse loop 302 selects one of the first through eighth phase clock signals P0, P45, . . . , P315 provided by the reference DLL 301 of FIG. 3 so that the phase difference between the external clock EXT_CLK and the coarse clock signal Coarse_CLK has a difference value between 0 and 0.25 T. The coarse loop 302 includes a 8:1 MUX portion 701, a first delay portion 702, an inverter 703, a fine voltage controlled delay line (FVCDL) circuit portion 704, a second delay portion 705, a replica buffer portion 706, a coarse phase detector 707, a final state machine (FSM) storing portion 708. The first and second delay portions 702 and 705 are replicated circuits of MUX portions 1002, 1004, 1006, 1012, 1014, and 1016 used for the fine loop 303 of FIG. 10.

The 8:1 MUX portion 701 selects one of the first through eighth phase clock signals P0, P45, . . . , P315 in response to the first select code R_SEL, and generates the first control clock signal FCLK. The first control clock signal FCLK is delayed for a predetermined time by the inverter 703 and thereafter provided as an enable signal of the FSM storage portion 708. The first control clock signal FCLK is delayed for a predetermined time by the first delay portion 702 and thereafter provided to the FVCDL circuit portion 704.

The FVCDL circuit portion 704 receives the second control voltage VCTL provided from the voltage regulator 404 of FIG. 4, as a power voltage, and includes a plurality of delay cells connected in series and receiving the delayed first control clock signal FCLK. The FVCDL circuit portion 704 has the minimum delay time and an output thereof is generated as a coarse cock signal Coarse_CLK after being delayed for a predetermined time by the second delay portion 705 and the replica buffer portion 706.

The coarse phase detector 707 compares the external clock EXT_CLK and the coarse clock signal Coarse_CLK and generates an up/down signal and a hold signal. The FSM storing portion 708 is enabled by the delayed first control clock signal FCLK and generates the first through third digital codes R_SEL, F_SEL, and R_SEL±1 in response to the up/down signal and the hold signal. The first through third digital codes R_SEL, F_SEL, and R_SEL±1 are generated at a falling edge of the first control clock signal FCLK to avoid a glitch.

Figure 8:
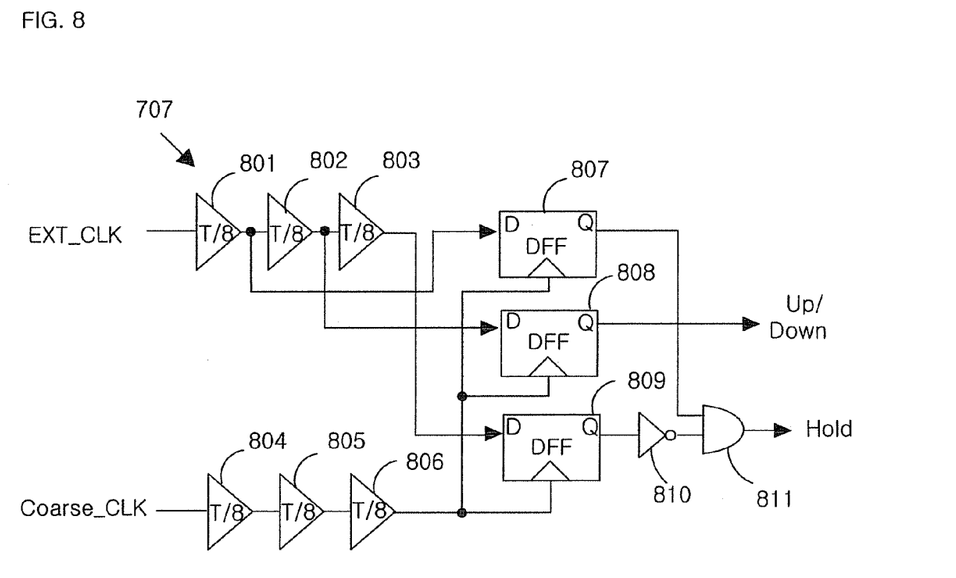
FIG. 8 is a circuit diagram of a coarse phase detection portion of FIG. 7.

FIG. 8 illustrates the coarse phase detector 707 of FIG. 7. Referring to FIG. 7, the coarse phase detector 707 includes first through third delay cells 801, 802, and 803 connected in series and receiving the external clock EXT_CLK, fourth through sixth delay cells 804, 805, and 806 connected in series and receiving the coarse clock signal Coarse_CLK, first through third D-flipflops 807, 808, and 809, an inverter 810, and an AND gate 811. The first through sixth delay cells 801-806 have a delay time of T/8. The first D-flipflop 807 receives an output of the first delay cell 801 in response to an output of the sixth delay cell 806. The second D-flipflop 808 receives an output of the second delay cell 802 in response to the output of the sixth delay cell 806 and outputs the up/down signal. The third D-flipflop 809 receives an output of the third delay cell 803 in response to the output of the sixth delay cell 806. The output of the third D-flipflop 809 is provided to the AND gate 811 via the inverter 810. The AND gate 811 receives an output of the inverter 810 and the output of the first D-flipflop and outputs the hold signal Hold.

The coarse phase detector 707 operates as follows. First, when a rising edge of the coarse clock signal Coarse_CLK is earlier than a rising edge of the external clock Ext_CLK by a phase difference that is greater than T/8, the up/down signal Up/Down becomes logic low. Otherwise, the up/down signal Up/Down becomes logic high. Second, when a rising edge of the coarse clock signal Coarse_CLK is earlier than a rising edge of the external clock Ext_CLK by a phase difference of 0-T/4, the hold signal Hold becomes logic high. Otherwise, the hold signal Hold becomes logic low.

When the hold signal Hold is logic high, the FSM storing portion 708 of FIG. 7 stops operation and maintains a previous value while the values of the first digital code R_SEL and the second digital code F_SEL are not changed. At this time, the coarse loop 302 of FIG. 7 is in a locked state. Even when the coarse loop 302 of FIG. 7 is in a locked state, the value of the third digital code R_SEL±1 can vary according to the up/down signal Up/Down. That is, when the up/down signal Up/Down is logic low, the third digital code R_SEL±1 selects a clock slower by T/8 than the clock that the first digital code R_SEL selected. Otherwise, the third digital code R_SEL±1 selects a clock faster by T/8.

Figure 9A:
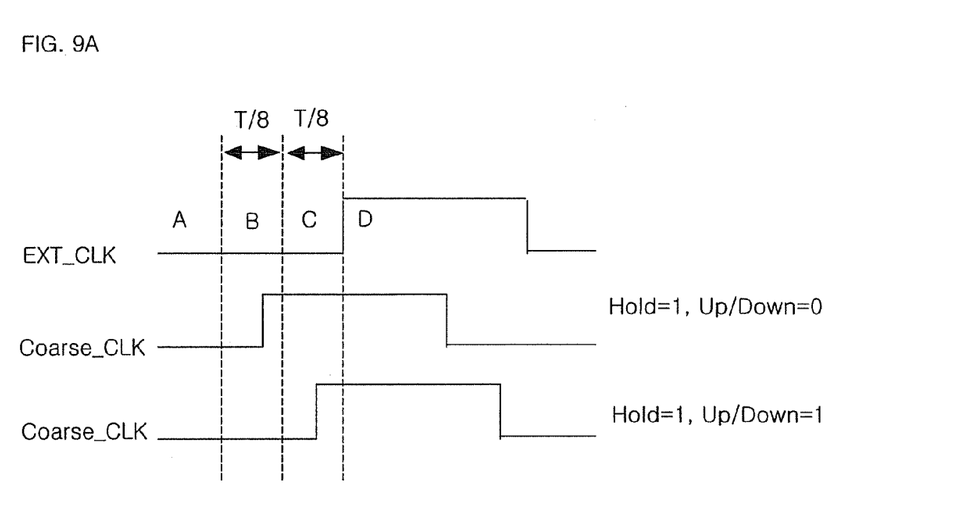
FIGS. 9A and 9B are views for explaining a relationship between an up/down signal, a hold signal, and a third digital code according to the operation of the coarse phase detection portion of FIG. 8.
Figure 9B:
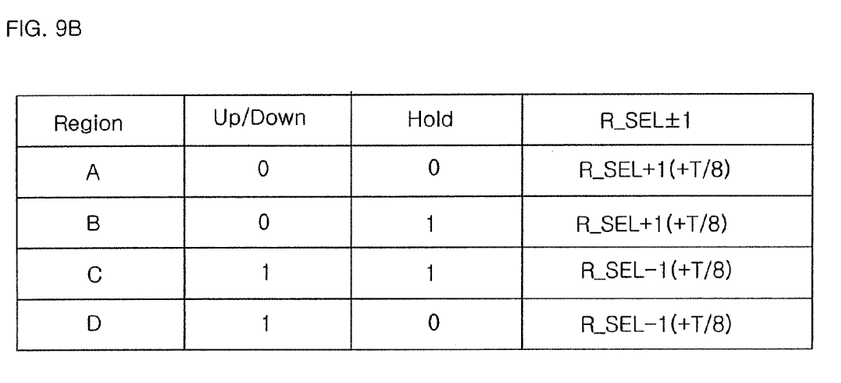

FIGS. 9A and 9B show relations among the up/down signal Up/Down, the hold signal Hold, and the third digital code R_SEL±1 according to the operation of the coarse phase detector 707. Referring to FIG. 9A, the coarse loop 302 is locked when the external clock EXT_CLK and the coarse clock signal Coarse_CLK are present in sections B and C, respectively, which have a phase difference within T/2. However, even when the coarse loop 302 is in a locked state, the phase difference between the external clock EXT_CLK and the coarse clock signal Coarse_CLK can be changed by a change in temperature and the power voltage. In this case, the coarse loop 302 begins the locking operation again so that the values of the first through third digital codes R_SEL, F_SEL, and R_SEL±1 are readjusted. This function enables the infinite phase shift of a clock with the seamless switching function.

Figure 10:
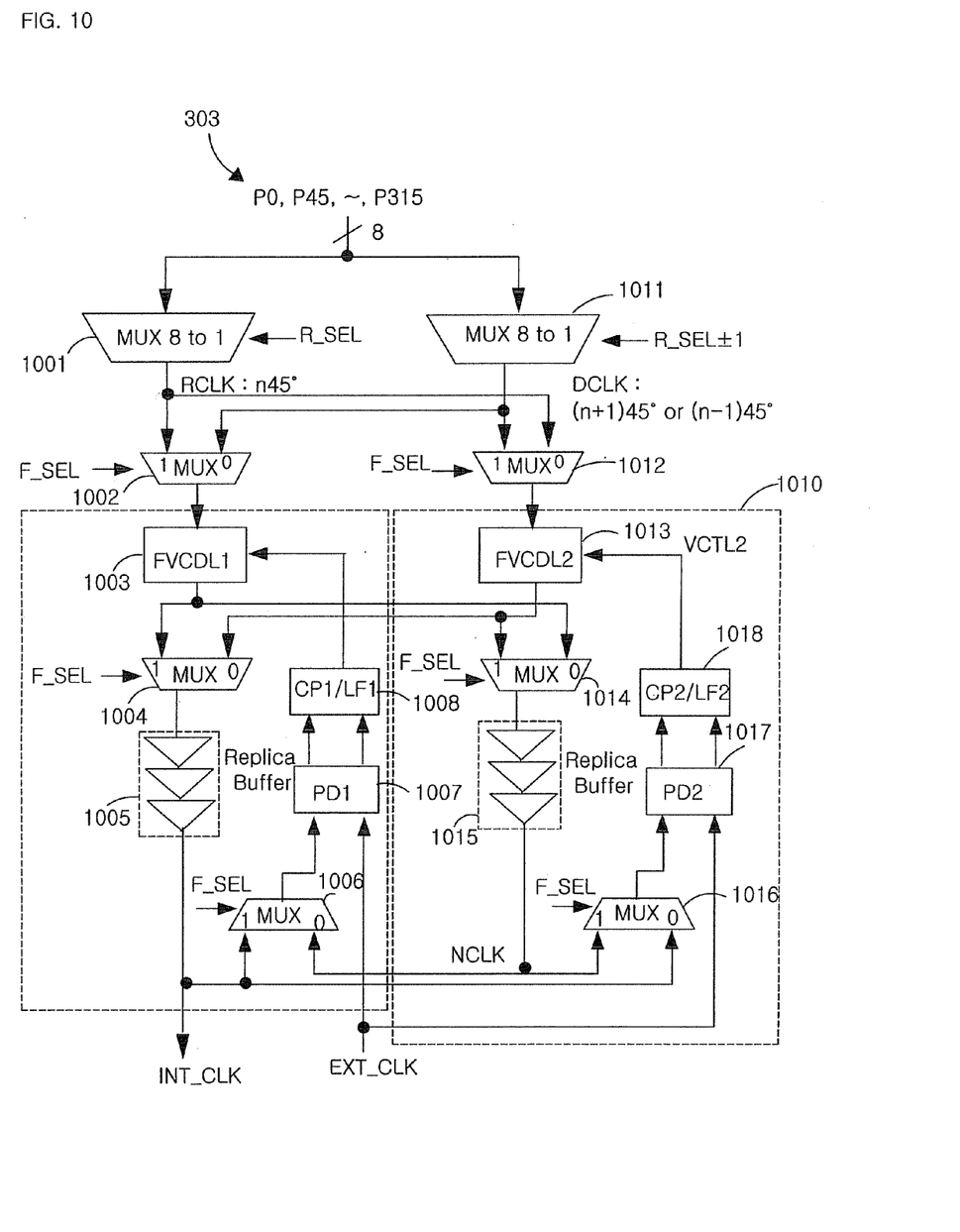
FIG. 10 is a circuit diagram of a fine loop of FIG. 3.

FIG. 10 illustrates the fine loop 303 of FIG. 3. Referring to FIG. 10, the fine loop 303 includes two loops 1000 and 1010 connected to cross each other, a plurality of 8:1 MUX portions 1001 and 1011, a plurality of 2:1 MUX portions 1002, 1004, 1006, 1012, 1014, and 1016, a plurality of FVCDL circuit portions 1003 and 1013, a plurality of replica buffers 1005 and 1015, a plurality of phase detectors 1007 and 1017, and a plurality of charge pumps and loop filters 1008 and 1018. The two loops 1000 and 1010 are used for a seamless switch function.

The first 8:1 MUX portion 1001 selects one of the first through eighth phase clock signals P0, P45, . . . , P315 provided by the reference DLL 301 in response to the first digital code R_SEL, and generates a second control clock signal RCLK. The second 8:1 MUX portion 1010 selects one of the first through eighth phase clock signals P0, P45, . . . , P315 provided by the reference DLL 301 in response to the third digital code R_SEL±1, and generates a third control clock signal DCLK. The third control clock signal DCLK is a signal faster or slower by a phase difference of 45° compared to the second control clock signal RCLK.

The first 2:1 MUX portion 1002 selects the second control clock signal RCLK or the third control clock signal DCLK in response to the second digital code F_SEL, and provides the selected signal to the first FVCDL circuit portion 1003. The second 2:1 MUX portion 1012 selects the second control clock signal RCLK or the third control clock signal DCLK in response to the second digital code F_SEL, and provides the selected signal to the second FVCDL circuit portion 1013.

The first FVCDL circuit portion 1003 receives the second control clock signal RCLK or the third control clock signal DCLK transferred through the first 2:1 MUX portion 1002 and a first control voltage VCTL1 output from the first charge pump and loop filter 1008 as a power voltage. The second FVCDL circuit portion 1013 receives the second control clock signal RCLK or the third control clock signal DCLK transferred through the second 2:1 MUX portion 1012 and a second control voltage VCTL2 output from the second charge pump and loop filter 1018 as a power voltage. The delay time of the first FVCDL circuit portion 1003 and the second FVCDL circuit portion 1013 has a value needed for a gentle phase change of the internal clock signal INT_CLK during a change of the fine loop 303.

The third 2:1 MUX portion 1004, in response to the second digital code F_SEL, transfers an output of the first FVCDL circuit portion 1003 or an output of the second FVCDL circuit portion 1013 to the first replica buffer portion 1005. The first replica buffer portion 1005 generates the internal clock signal INT_CLK. The fourth 2:1 MUX portion 1014, in response to the second digital code F_SEL, transfers the output of the FVCDL circuit portion 1003 or an output of the second FVCDL circuit portion 1013 to the second replica buffer portion 1015. The second replica buffer portion 1015 generates a fourth control clock signal NCLK.

The fifth 2:1 MUX portion 1006, in response to the second digital code F_SEL, transfers the internal clock signal INT_CLK or the fourth control clock signal NCLK to the first phase detector 1007. The first phase detector 1007 detects a phase difference between the internal clock signal INT_CLK or the fourth control clock signal NCLK provided by the fifth 2:1 MUX portion 1006, and the external clock signal EXT_CLK. The first charge pump and loop filter 1008 generates the first control voltage VCTL1 proportional to the phase difference and provides the generated first control voltage VCTL1 to the first FVCDL circuit portion 1003.

The sixth 2:1 MUX portion 1016, in response to the second digital code F_SEL, transfers the external clock signal EXT_CLK or the fourth control clock signal NCLK to the second phase detector 1017. The second phase detector 1017 detects a phase difference between the internal clock signal INT_CLK or the fourth control clock signal NCLK provided by the sixth 2:1 MUX portion 1016, and the external clock signal EXT_CLK. The second charge pump and loop filter 1018 generates the second control voltage VCTL2 proportional to the phase difference and provides the generated second control voltage VCTL2 to the second FVCDL circuit portion 1013.

The first loop 1000 includes the first FVCDL circuit portion 1003, the first phase detector 1007, and the first charge pump and loop filter 1008, and receives the second control clock signal RCLK and outputs the internal clock signal INT_CLK as an output signal. The second loop 1010 includes the second FVCDL circuit portion 1013, the second phase detector 1017, and the second charge pump and loop filter 1018, and receives the third control clock signal DCLK and outputs the fourth clock signal NCLK as an output signal. Accordingly, the internal clock signal INT_CLK and the fourth clock signal NCLK are synchronized with the external clock signal EXT_CLK by the operation of the two loops 1000 and 1010.

Since the second control clock signal RCLK and the fourth control clock signal NCLK have a phase difference of 45°, the first FVCDL circuit portion 1003 and the second FVCDL circuit portion 1013 have a delay time difference of T/8 (=45°). When the coarse loop 302 of FIG. 7 loses locking and changes the first digital code R_SEL, the third control clock signal DCLK is generated after the second control clock signal RCLK changes, and determined by the third digital code R_SEL±1.

When the first digital code R_SEL changes and the second control clock signal RCLK is changed to a neighboring clock, the second digital code F_SEL is changed to be logic low. At this time, the second loop 1010 receives the second control clock signal RCLK and outputs the internal clock signal INT_CLK. The first loop 1000 receives the third control clock signal DCLK and outputs the fourth control clock signal NCLK.

Figure 11A:
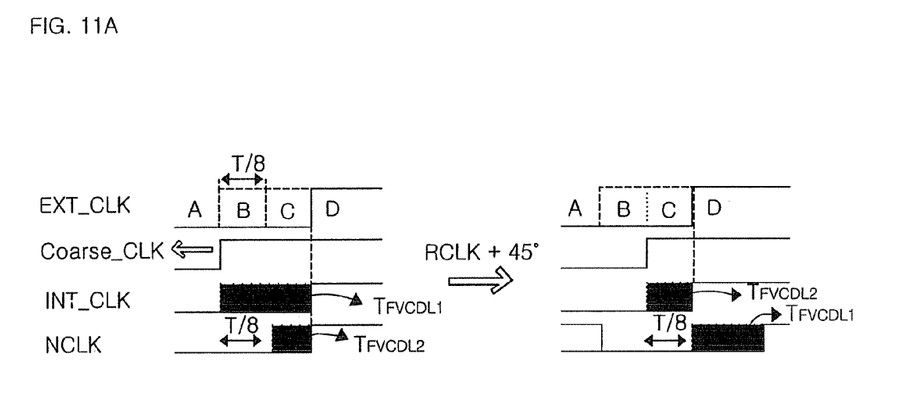
FIGS. 11A and 11B are timing diagrams for explaining the operation of the fine loop of FIG. 10 in relation with the coarse loop of FIG. 7.
Figure 11B:
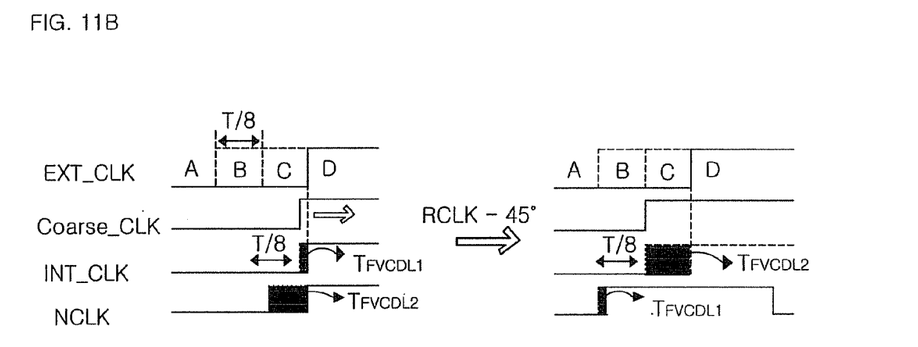

FIGS. 11A and 11B are timing diagrams for explaining the operation of the fine loop 303 of FIG. 10 in relation with the coarse loop 302. It can be seen that, when the first digital code R_SEI changes, the phase of the second control clock signal RCLK is increased or decreased by 45°.

FIG. 11A shows a case in which the phase of the second control clock signal RCLK increases by 45°. In this case, a rising edge of the coarse clock signal Coarse_CLK is disposed in a section B, the fourth control clock signal NCLK is disposed at a position which is 45° later to the internal clock signal INT_CLK, and the delay time of the first FVCDL circuit portion 1003 is greater by T/8 (=45°) than that of the second FVCDL circuit portion 1013. At this time, the second digital code F_SEL is assumed to be logic high. When the rising edge of the coarse clock signal Coarse_CLK is moved from the section B to a section A, the coarse loop 303 increases the phase of the second control clock signal RCLK by 45°.

When the second digital code F_SEL is logic low, the second control clock signal RCLK is input to the second FVCDL circuit portion 1013 and the output of the second loop 1010 is connected to the internal clock signal INT_CLK. In this method, the increase of 45° in the phase generated in the second control clock signal RCLK is offset by a decrease in the delay time of T/8 (=45°) generated by the switch of the first FVCDL circuit portion 1003 and the second FVCDL circuit portion 1013. Thus, the internal clock signal INT_CLK does not undergo a rapid phase change in the section of a change of the fine loop 303.

FIG. 11B shows a case in which the phase of the second control clock signal RCLK decreases by 45°. In this case, a rising edge of the coarse clock signal Coarse_CLK is disposed in a section C, the fourth control clock signal NCLK is disposed at a position which is 45° earlier to the internal clock signal INT_CLK, and the delay time of the second FVCDL circuit portion 1013 is greater by T/8 (=45°) than that of the first FVCDL circuit portion 1003. When the second digital code F_SEL is logic high and the rising edge of the coarse clock signal Coarse_CLK is moved from the section C to a section D, the coarse loop 303 decreases the phase of the second control clock signal RCLK by 45°.

Figure 12:
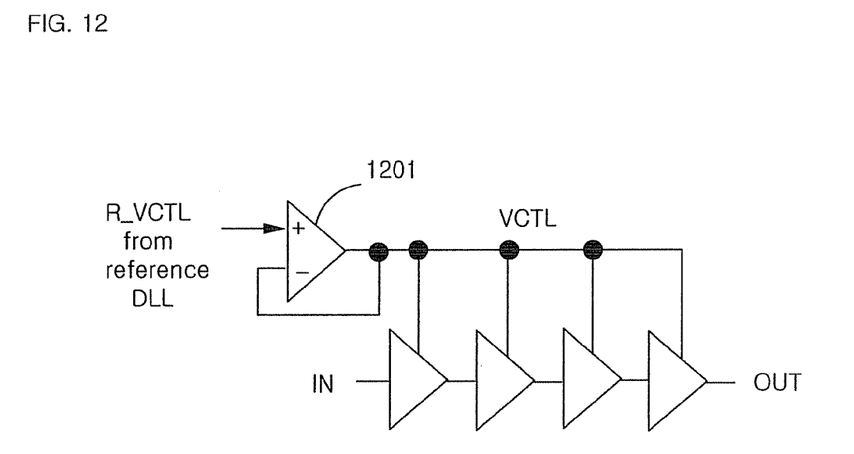
FIG. 12 is a circuit diagram of an example of a FVCDL circuit portion used in the fine loop of FIG. 10.

FIG. 12 shows an example of the FVCDL circuit portions 1003 and 1013 used for the fine loop 303 of the FIG. 10. Referring to FIG. 12, a FVCDL circuit portion 1200 includes a voltage regulator 1201 receiving the first control voltage R_VCTL and the second control voltage VCTL provided by the reference DLL 301 of FIG. 4 and generating the second control voltage VCTL, and a plurality of delay cells 1202, 1203, 1204, and 1205 driven by the second control voltage VCTL, receiving an input signal IN, and connected in series.

Figure 13:
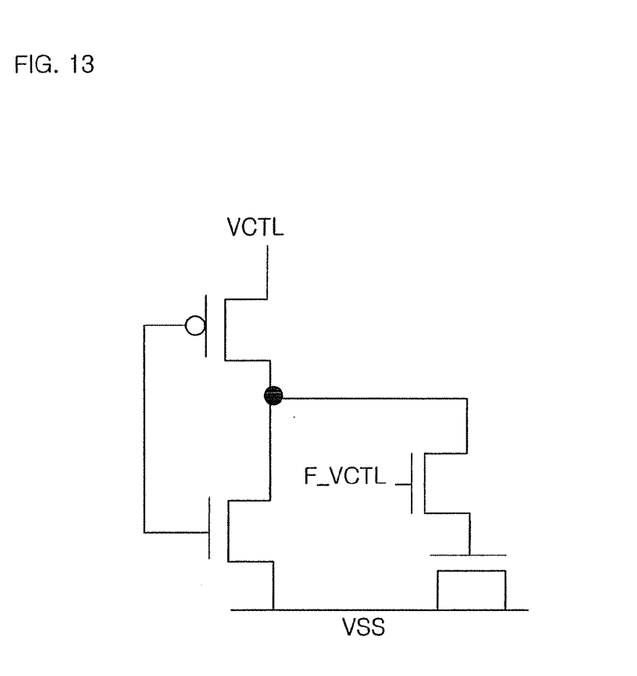
FIG. 13 is a circuit diagram of delay cells of FIG. 12.

FIG. 13 is a circuit diagram of the delay cells 1202, 1203, 1204, and 1205 of FIG. 12. Referring to FIG. 13, each of the delay cells 1202, 1203, 1204, and 1205 includes a PMOS transistor 1301 and a first NMOS transistor 1302 connected in series between the second control voltage VCTL and the ground voltage VSS and receiving the input signal IN at gates thereof, a second NMOS transistor 1303 having a drain connected to drains of the PMOS transistor 1301 and the first NMOS transistor 1302 and receiving the third control voltage F_VCTL at a gate thereof, and a third NMOS transistor 1304 having a gate connected to a source of the second NMOS transistor 1303 and having a source and a drain connected to the ground voltage VSS.

The delay cells 1202, 1203, 1204, and 1205 have two delay time control voltages. One is the second control voltage VCTL that is an output of the voltage regulator 1201 and the other one is the third control voltage F_VCTL used for changing a capacitor value. As described above, the FVCDL circuit portions 1003 and 1013 need to generate a delay time of 25% of a clock cycle. Since the cycle of the reference DLL 301 of the present invention is proportional to the delay time of the inverter, the following inequalities are established.

$$T \propto \frac{C_{LD}}{\beta(VCTL - V_{TH})} \quad \text{[Inequality 2]}$$

Here, β denotes $\mu C_{OX}$ of a MOSFET and $C_{LD}$ denotes a capacitance value of an output of a delay cell having a CMOS inverter structure of the reference DLL 301. When the third control voltage F_VCTL changes, the capacitance value of an output node of the delay cell of the FVCDL circuit portion 1200, the maximum change amount of the FVCDL circuit portion 1200 is as follows.

$$\Delta T_{FVCDL} \propto \frac{\Delta C_{VLD}}{\beta(VCTL - V_{TH})} \quad \text{[Inequality 3]}$$

Here, $\Delta C_{VLD}$ denotes the maximum change amount of capacitance of an output node of the delay cell according to the third control voltage F_VCTL. Thus, when the above two inequalities are compared to calculate the change amount of the FVCDL circuit portion 1200 according to the cycle, the following inequality is obtained.

$$\frac{\Delta T_{FVCDL}}{T} \propto \frac{\Delta C_{VLD}}{C_{LD}} \quad \text{[Inequality 4]}$$

Here, since $\Delta C_{VLD}$ and $C_{LD}$ are values irrelevant to the clock cycle T, a change rate according to the cycle of the FVCDL circuit portion 1200 has a constant value regardless of the T according to Inequality 4. When a PVT change occurs, $C_{LD}$ has an almost constant value and $\Delta C_{VLD}$ has the smallest value when the speed is slow. Thus, 25% of T must be satisfied at this time.

Figure 14:
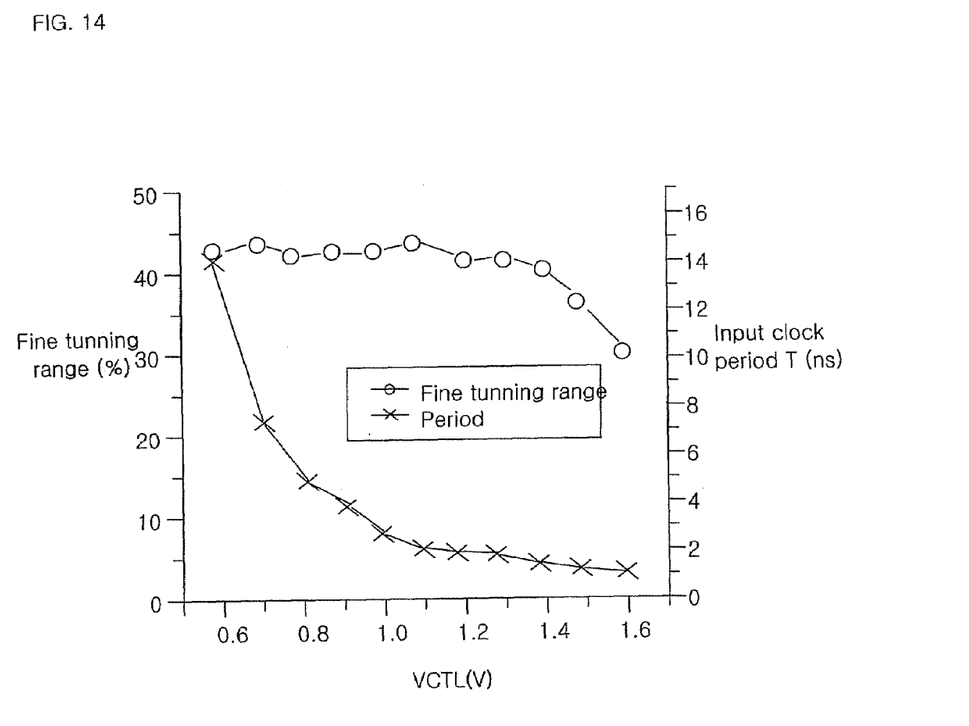
FIG. 14 is a graph showing a value of a clock cycle T according to a relative fine adjustment range and a second control voltage VCTL of a FVCDL circuit portion of FIG. 12.

FIG. 14 shows a relative fine control range of the FVCDL circuit portion 1200 and a value of the clock cycle T according to the second control voltage VCTL. While the maximum and minimum values of the T are 15.2 ns and 1.38 ns, respectively, the maximum and minimum values of the $$\frac{\Delta T_{FVCDL}}{T}$$

are 45% and 30%, respectively. This proves that, while the clock cycle with respect to the second control voltage VCTL range has a difference of 11.5 times, $$\frac{\Delta T_{FVCDL}}{T}$$

has a value greater than 25% that is a necessary value.

While this invention has been particularly shown and described with reference to preferred embodiments thereof, it will be understood by those skilled in the art that various changes in form and details may be made therein without departing from the spirit and scope of the invention as defined by the appended claims.

As described above, the dual loop DLL according to the present invention using an analog VCDL, not a conventional digital phase detector, has a wide operation frequency range and a seamless infinite phase shift function so that, owing to a property of the analog VCDL, an output clock of the dual loop DLL has a small amount of jitter. The reference DLL has a wide operation frequency range by using a simple phase detector and charge pump. Also, by using two VCDLs in the fine loop, a VCDL is changed to another VCDL having an appropriate value when the phase is changed so that a seamless and infinite phase shift is possible.

What is claimed is:

1. A dual loop DLL for generating an internal clock signal synchronized with an external clock, the dual loop DLL comprising:
    a reference DLL receiving a reference clock and generating a plurality of phase clock signals having a first phase difference;
    a coarse loop selecting one of the phase clock signals and generating first through third digital codes to allow the internal clock signal to have a phase difference less than a second phase difference with respect to the external clock; and
    a fine loop selecting two of the phase clock signals and synchronizing the internal clock signal with the external clock, in response to the first through third digital codes.

2. The dual loop DLL as claimed in claim 1, wherein in the reference DLL the first phase difference of the phase clock signals is 45°.

3. The dual loop DLL as claimed in claim 1, wherein in the coarse loop the second phase difference between the internal clock signal and the external clock is smaller than 90°.

4. The dual loop DLL as claimed in claim 1, wherein the reference DLL comprises:
    a first phase detector and charge pump sync portion detecting a phase of a first phase clock signal and a phase of a fifth phase clock signal having a phase difference of 180° with respect to the first phase clock signal and generating a charge pump enable signal and a first control voltage, in response to a reset signal;
    a second phase detector and charge pump portion detecting the phase of the first phase clock signal and a phase of a ninth phase clock signal having a phase difference of 360° with respect to the first phase clock signal and generating the first control voltage proportional to the phase difference;
    a first loop filter removing jitter of the first control voltage;
    a voltage regulator receiving the first control voltage and a second control voltage and generating the second control voltage;
    a VCDL circuit portion receiving the second control voltage as a power voltage, including a plurality of delay cells connected in series and receiving the reference clock as an input, and generating outputs of the delay cell as voltage control signals;
    a level converter and buffer portion receiving the voltage control delay signals and generating a plurality of phase clock signals; and
    a second loop filter removing jitter of the second control voltage.

5. The dual loop DLL as claimed in claim 4, wherein the first phase detector comprises:
    a D-flipflop outputting the first phase clock signal in response to the fifth phase clock signal; and
    an S-R latch generating the charge pump enable signal in response to an output of the D-flipflop and the reset signal.

6. The dual loop DLL as claimed in claim 4, wherein the charge pump sync portion comprises:
- a PMOS transistor in which a power voltage is connected to a source thereof and the reset signal is connected to a gate thereof;
- a first NMOS transistor in which a drain of the PMOS transistor is connected to a drain thereof so that the first control voltage is generate, and an output of the S-R latch is connected to a gate thereof;
- a second NMOS transistor in which the drain of the first NMOS transistor is connected to a drain thereof and the reset signal is connected to a gate thereof; and
- a third NMOS transistor in which the drain of the second NMOS transistor is connected to a drain thereof, a ground voltage is connected to a source thereof, and a bias voltage is connected to a gate.

7. The dual loop DLL as claimed in claim 1, wherein the coarse loop comprises:
- a 8:1 MUX portion selecting one of the phase clock signals in response to the first digital code and generating a first control clock signal;
- a first delay portion receiving the first control clock signal;
- an inverter receiving the first control clock signal;
- a fine voltage control delay line (FVCDL) circuit portion including a plurality of delay cells connected in series and receiving an output of the first delay portion and driven by a control voltage generated by the reference DLL;
- a second delay portion receiving an output of the FVCDL circuit portion;
- a replica buffer portion receiving an output of the second delay portion and generating a coarse clock signal;
- a coarse phase detecting portion comparing a phase difference between the external clock signal and the coarse clock signal and generating an up/down signal and a hold signal; and
- a final state machine (FSM) storing portion enabled by the first control clock signal that is an output of the inverter and delayed, and generating the first through third digital codes in response to the up/down signal and the hold signal.

8. The dual loop DLL as claimed in claim 7, wherein the coarse phase detecting portion comprises:
- first through third delay cells connected in series and receiving the external clock;
- fourth through sixth delay cells connected in series and receiving the coarse clock signal;
- a first D-flipflop generating an output as an output of the first delay cell received in response to an output of the sixth delay cell;
- a second D-flipflop generating the up/down signal as an output from an output of the second delay cell received in response to the output of the sixth delay cell;
- a third D-flipflop generating an output as an output of the third delay cell received in response to the output of the sixth delay cell;
- the inverter receiving the output of the third D-flipflop; and
- an AND gate receiving an output of the inverter and the output of the first D-flipflop and outputting the hold signal.

9. The dual loop DLL as claimed in claim 1, wherein the fine loop comprises:
- a first 8:1 MUX portion selecting one of the phase clock signals in response to the first digital code and generating a second control clock signal;
- a second 8:1 MUX portion selecting one of the phase clock signals in response to the third digital code and generating a third control clock signal;
- a first 2:1 MUX portion selecting the second control clock signal or the third control clock signal in response to the second digital code and providing the selected signal to a first fine voltage control delay line (FVCDL) circuit portion;
- a second 2:1 MUX portion selecting the second control clock signal or the third control clock signal in response to the second digital code and providing the selected signal to a second fine voltage control delay line (FVCDL) circuit portion;
- the first fine voltage control delay line (FVCDL) circuit portion including a plurality of delay cells connected in series and receiving the second control clock signal or the third control clock signal provided by the first 2:1 MUX portion, the delay cells being driven by a first control voltage output from a first charge pump or loop filter;
- the second fine voltage control delay line (FVCDL) circuit portion including a plurality of delay cells connected in series and receiving the second control clock signal or the third control clock signal provided by the second 2:1 MUX portion, the delay cells being driven by a second control voltage output from a second charge pump or loop filter;
- a third 2:1 MUX portion providing an output of the first fine voltage control delay line (FVCDL) circuit portion or an output of the second fine voltage control delay line (FVCDL) circuit portion to a first replica buffer portion, in response to the second digital code;
- the first replica buffer portion receiving an output of the third 2:1 MUX portion and generating the internal clock signal;
- a fourth 2:1 MUX portion providing an output of the first fine voltage control delay line (FVCDL) circuit portion or an output of the second fine voltage control delay line (FVCDL) circuit portion to a second replica buffer portion, in response to the second digital code;
- the second replica buffer portion receiving an output of the fourth 2:1 MUX portion and generating a fourth control clock signal;
- a fifth 2:1 MUX portion providing the internal clock signal or the fourth control clock signal to a first phase detector, in response to the second digital code;
- the first phase detector detecting a phase difference between the external clock signal and the internal clock signal or the fourth control clock signal provided by the fifth 2:1 MUX portion;
- the first charge pump and loop filter generating the first control voltage proportional to the phase difference detected by the first phase detector and providing the generated first control voltage to the first fine voltage control delay line (FVCDL) circuit portion;
- a sixth 2:1 MUX portion providing the external clock signal or the fourth control clock signal to a second phase detector in response to the second digital code;
- the second phase detector detecting a phase difference between the internal clock signal and the external clock signal or the fourth control clock signal provided by the sixth 2:1 MUX portion; and
- the second charge pump and loop filter generating the second control voltage proportional to the phase difference detected by the second phase detector and providing the generated second control voltage to the second fine voltage control delay line (FVCDL) circuit portion.

10. The dual loop DLL as claimed in claim 9, wherein in the dual loop DLL the third control clock signal is faster or slower by a phase difference of 45° with respect to the second control clock signal.

11. The dual loop DLL as claimed in claim 9, wherein each of the delay cells of the first and second fine voltage control delay line (FVCDL) circuit portions comprises:

a PMOS transistor and a first NMOS transistor connected in series between the first or second control voltage and a ground voltage and receiving an input signal (IN) at each of gates thereof;

a second NMOS transistor having a drain connected to drains of the PMOS transistor and the first NMOS transistor and receiving a third control voltage at a gate thereof; and a third NMOS transistor having a gate connected to a source of the second NMOS transistor and a source and a drain connected to the ground voltage.

* * * * *